US012622273B2

(12) United States Patent
Jun et al.

(10) Patent No.: US 12,622,273 B2
(45) Date of Patent: May 5, 2026

(54) FAN-OUT TYPE SEMICONDUCTOR PACKAGE AND METHOD OF MANUFACTURING THE SAME

(71) Applicant: SAMSUNG ELECTRONICS CO., LTD., Suwon-si (KR)

(72) Inventors: Joonho Jun, Suwon-si (KR); Sangsick Park, Suwon-si (KR); Chungsun Lee, Suwon-si (KR); Hyoungjoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 517 days.

(21) Appl. No.: 18/085,859

(22) Filed: Dec. 21, 2022

(65) Prior Publication Data

US 2023/0420336 A1 Dec. 28, 2023

(30) Foreign Application Priority Data

Jun. 24, 2022 (KR) ........................ 10-2022-0077393

(51) Int. Cl.
*H01L 23/48* (2006.01)
*H01L 21/56* (2006.01)
(Continued)

(52) U.S. Cl.
CPC .............. *H01L 23/42* (2013.01); *H01L 21/56* (2013.01); *H01L 23/3157* (2013.01);
(Continued)

(58) Field of Classification Search
None
See application file for complete search history.

(56) References Cited

U.S. PATENT DOCUMENTS 8,999,760 B2 4/2015 Pagaila et al.
9,466,554 B2 10/2016 Lee et al.
(Continued)

FOREIGN PATENT DOCUMENTS

KR 10-2015-0033937 A 4/2015
KR 10-2016475 B1 9/2019
(Continued)

OTHER PUBLICATIONS

Communication dated Mar. 12, 2026 issued by the Korean Ministry of Intellectual Property in Korean Patent Application No. 10-2022-0077393.

*Primary Examiner* — Long Pham
(74) *Attorney, Agent, or Firm* — Sughrue Mion, PLLC

(57) ABSTRACT

A fan-out type semiconductor package is provided and may include: a package substrate; an interposer on an upper surface of the package substrate, the interposer including upper pads and lower pads electrically connected with the upper pads; conductive bumps between the package substrate and the lower pads of the interposer and electrically connecting the package substrate with the interposer; a semiconductor chip on a central portion of an upper surface of the interposer and electrically connected with the upper pads of the interposer; a molding member on an edge portion of the upper surface of the interposer, the molding member including an upper surface coplanar with an upper surface of the semiconductor chip; and a metal pillar structure vertically extending from the upper surface of the molding member to a lower surface of the interposer and configured to individually make contact with the lower pads of the interposer.

16 Claims, 11 Drawing Sheets

(51) Int. Cl.

| | | |
|---|---|---|
| *H01L 23/00* | (2006.01) | |
| *H01L 23/31* | (2006.01) | |
| *H01L 23/42* | (2006.01) | |
| *H01L 23/498* | (2006.01) | |

(52) U.S. Cl.
CPC .. *H01L 23/49816* (2013.01); *H01L 23/49833* (2013.01); *H01L 24/16* (2013.01); *H01L 24/81* (2013.01); *H01L 2224/16227* (2013.01); *H01L 2224/81* (2013.01)

(56) References Cited

U.S. PATENT DOCUMENTS

| | | | |
|---|---|---|---|
| 9,576,926 B2 * | 2/2017 | Yu ........................ | H01L 23/5384 |
| 9,859,267 B2 | 1/2018 | Hou et al. | |
| 10,804,242 B2 * | 10/2020 | Yu ..................... | H01L 23/49838 |
| 10,971,476 B2 | 4/2021 | Gu et al. | |
| 11,062,997 B2 * | 7/2021 | Jeng ..................... | H01L 25/105 |
| 11,195,800 B2 | 12/2021 | Jang | |
| 11,239,185 B2 | 2/2022 | Gutierrez, III et al. | |
| 2022/0359447 A1 * | 11/2022 | Chen ........................ | H01L 24/97 |

FOREIGN PATENT DOCUMENTS

| | | | |
|---|---|---|---|
| KR | 10-2021-0030951 A | 3/2021 | |
| WO | 2020-010207 A1 | 1/2020 | |

* cited by examiner

FAN-OUT TYPE SEMICONDUCTOR PACKAGE AND METHOD OF MANUFACTURING THE SAME

CROSS-REFERENCE TO RELATED APPLICATION

This application claims priority from Korean Patent Application No. 10-2022-0077393, filed on Jun. 24, 2022, in the Korean Intellectual Property Office, the contents of which are herein incorporated by reference in their entirety.

BACKGROUND

1. Field

Example embodiments of the present disclosure relate to a fan-out type semiconductor package and a method of manufacturing the same. More particularly, example embodiments of the present disclosure relate to a fan-out type semiconductor package including an interposer between a semiconductor chip and a package substrate, and a method of manufacturing the fan-out type semiconductor package.

2. Description of the Related Art

Generally, a fan-out type semiconductor package may include an interposer arranged between a semiconductor chip and a package substrate. A molding member may be formed on an upper surface of the interposer to surround the semiconductor chip. The interposer may be electrically connected with the package substrate through a plurality of conductive bumps.

According to related art, the interposer may be bonded to the package substrate using a bond tool. When the bond tool thermally compresses an upper surface of the molding member, heat may be applied from the bond tool to the conductive bumps through the semiconductor chip and the molding member.

However, the molding member may have a low thermal conductivity. Thus, a sufficient heat may not be applied to the conductive bump under the molding member. Before the conductive bump may be normally wetted, a solvent in the molding member may be eluted. As a result, the conductive bump under the molding member may not be accurately bonded to the package substrate to generate an electrical connection between the interposer and the package substrate.

Further, when bond tool compresses the upper surface of the molding member, a warpage may be generated at the semiconductor chip and/or the interposer.

SUMMARY

Example embodiments provide a fan-out type semiconductor package that may be capable of securing an electrical connection between an interposer and a package substrate and suppressing a warpage of the semiconductor chip and/or the interposer.

Example embodiments also provide a method of manufacturing the above-mentioned fan-out type semiconductor package.

According to example embodiments, a fan-out type semiconductor package is provided. The fan-out type semiconductor package includes: a package substrate; an interposer on an upper surface of the package substrate, the interposer including upper pads and lower pads electrically connected with the upper pads; conductive bumps between the package substrate and the lower pads of the interposer and electrically connecting the package substrate with the interposer; a semiconductor chip on a central portion of an upper surface of the interposer and electrically connected with the upper pads of the interposer, the semiconductor chip having a width narrower than a width of the interposer; a molding member on an edge portion of the upper surface of the interposer such as to surround side surfaces of the semiconductor chip, the molding member including an upper surface coplanar with an upper surface of the semiconductor chip; and a metal pillar structure vertically extending from the upper surface of the molding member to a lower surface of the interposer and configured to individually make contact with the lower pads of the interposer, the metal pillar structure having a cross-sectional area that is equal to or greater than a cross-sectional area of each of the lower pads of the interposer.

According to example embodiments, a fan-out type semiconductor package is provided. The fan-out type semiconductor package includes: a package substrate; an interposer on an upper surface of the package substrate, the interposer including upper pads and lower pads electrically connected with the upper pads; conductive bumps between the package substrate and the lower pads of the interposer and electrically connecting the package substrate with the interposer; a semiconductor chip on a central portion of an upper surface of the interposer and electrically connected with the upper pads of the interposer, the semiconductor chip having a width narrower than a width of the interposer; a molding member on an edge portion of the upper surface of the interposer such as to surround side surfaces of the semiconductor chip, the molding member including an upper surface coplanar with an upper surface of the semiconductor chip; and a pillar structure in the molding member, the pillar structure including a material having a thermal conductivity higher than a thermal conductivity of the molding member.

According to example embodiments, method of manufacturing a fan-out type semiconductor package is provided. The method includes: bonding a semiconductor chip to a central portion of an upper surface of an interposer; forming a molding member on an edge portion of the upper surface of the interposer such that the molding member surrounds the semiconductor chip; forming openings that extend vertically through the molding member; filling the openings with a material, which has a thermal conductivity higher than a thermal conductivity of the molding member, to form a pillar structure; arranging conductive bumps between the interposer and an upper surface of a package substrate; and thermally compressing an upper surface of the molding member using a bond tool for applying heat to the conductive bumps through the pillar structure to bond the interposer to the package substrate.

According to example embodiments, the heat of the bond tool may be rapidly transferred to the conductive bumps between the interposer and the package substrate under the molding member through the pillar structure in the molding member so that the conductive bumps may be sufficiently wetted. Thus, the interposer may be firmly boned to the package substrate via the sufficiently wetted conductive bumps to prevent an electrical connection fail between the interposer and the package substrate.

Further, the pillar structure in the molding member may function as to reinforce strength of the molding member. Thus, a warpage may not be generated at the semiconductor chip and/or the interposer in thermally compressing the upper surface of the molding member using the bond tool.

BRIEF DESCRIPTION OF DRAWINGS

Example embodiments will be more clearly understood from the following detailed description taken in conjunction with the accompanying drawings. FIGS. 1 to 13 represent non-limiting, example embodiments as described herein.

FIG. 1 is a cross-sectional view illustrating a fan-out type semiconductor package in accordance with example embodiments;

FIG. 2 is a plan view illustrating the fan-out type semiconductor package in FIG. 1;

FIG. 3 is an enlarged cross-sectional view illustrating a connection between a pillar structure and lower pads of an interposer in the fan-out type semiconductor package in FIG. 1;

FIG. 4 is an enlarged cross-sectional view illustrating a connection between a pillar structure and lower pads of an interposer in a fan-out type semiconductor package in accordance with example embodiments;

FIG. 5 is a plan view illustrating a fan-out type semiconductor package in accordance with example embodiments;

FIG. 6 is a plan view illustrating a fan-out type semiconductor package in accordance with example embodiments;

FIG. 7 is a first cross-sectional view illustrating a method of manufacturing the fan-out type semiconductor package in FIG. 1;

FIG. 8 is a second cross-sectional view illustrating the method of manufacturing the fan-out type semiconductor package in FIG. 1;

FIG. 9 is a third cross-sectional view illustrating the method of manufacturing the fan-out type semiconductor package in FIG. 1;

FIG. 10 is a fourth cross-sectional view illustrating the method of manufacturing the fan-out type semiconductor package in FIG. 1;

FIG. 11 is a fifth cross-sectional view illustrating the method of manufacturing the fan-out type semiconductor package in FIG. 1;

FIG. 12 is a cross-sectional view illustrating a fan-out type semiconductor package in accordance with example embodiments; and FIG. 13 is an enlarged cross-sectional view illustrating a connection between a pillar structure and lower pads of an interposer in the fan-out type semiconductor package in FIG. 12.

DETAILED DESCRIPTION

Hereinafter, non-limiting example embodiments will be explained in detail with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element (or layer) or intervening elements (or layers) may be present. In contrast, when an element or layer is referred to as being "directly over," "directly above," "directly on," "directly below," "directly under," "directly beneath," "directly connected to" or "directly coupled to" another element or layer, there are no intervening elements or layers present.

Figure 1:
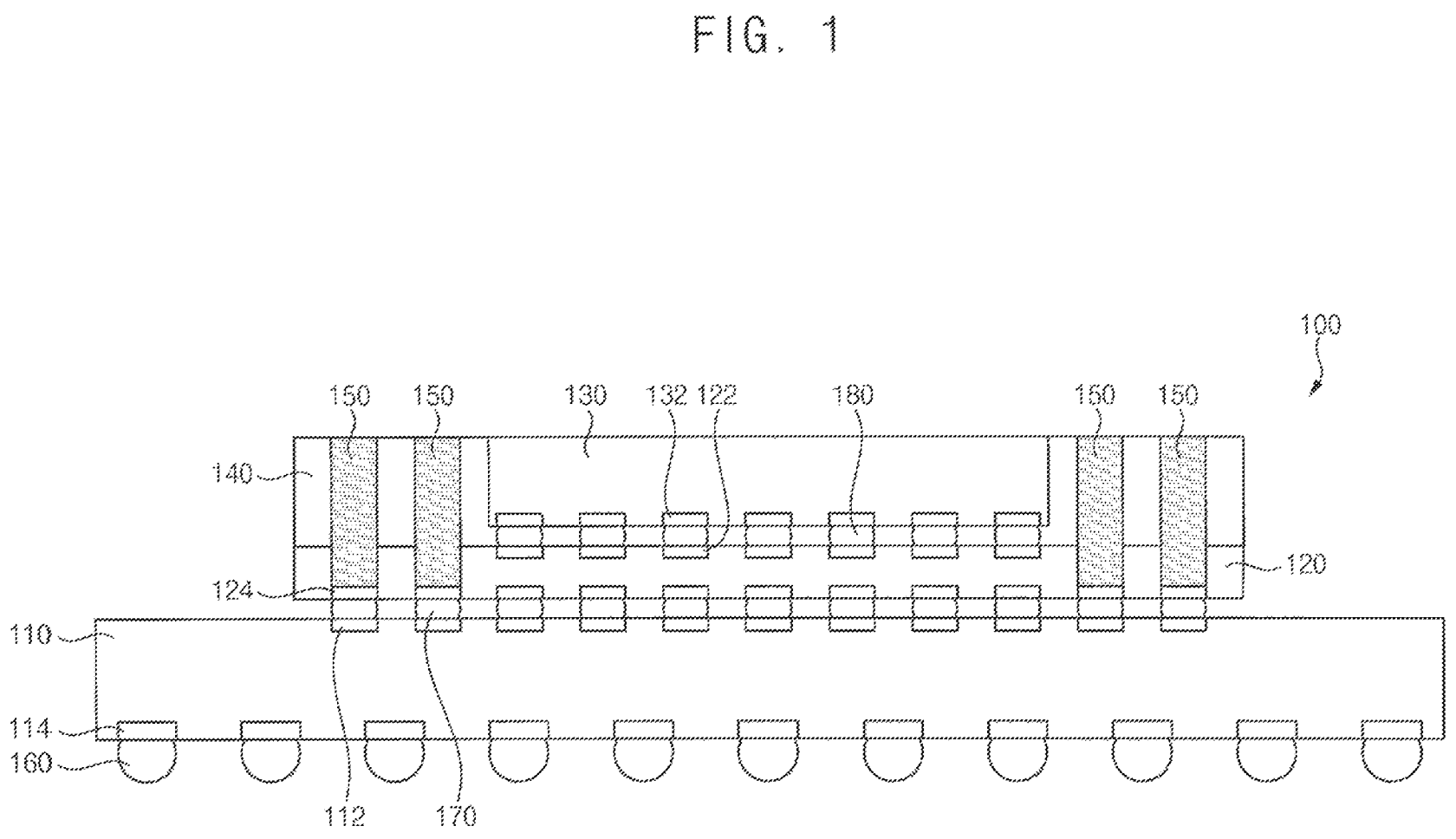
Figure 2:
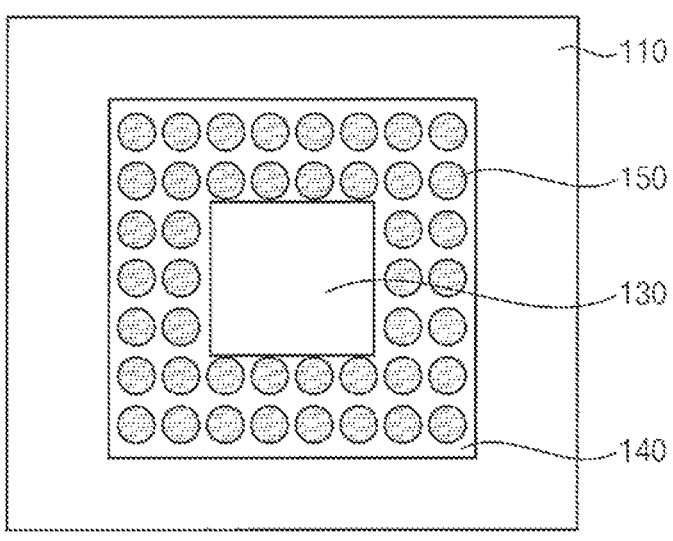
Figure 3:
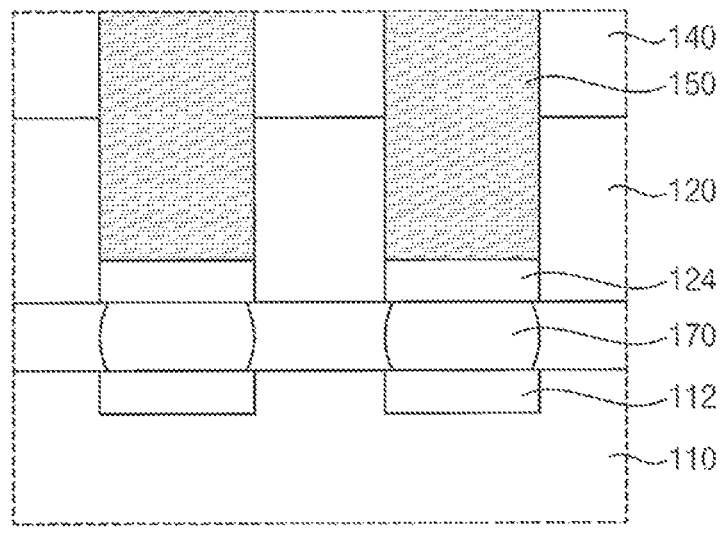

FIG. 1 is a cross-sectional view illustrating a fan-out type semiconductor package in accordance with example embodiments, FIG. 2 is a plan view illustrating the fan-out type semiconductor package in FIG. 1 and FIG. 3 is an enlarged cross-sectional view illustrating a connection between a pillar structure and lower pads of an interposer in the fan-out type semiconductor package in FIG. 1.

Referring to FIGS. 1 to 3, a fan-out type semiconductor package 100 of example embodiments may include a package substrate 110, an interposer 120, a semiconductor chip 130, a molding member 140, a plurality of external terminals 160, and a pillar structure 150.

The package substrate 110 may include an insulation substrate, a plurality of upper pads 112, and a plurality of lower pads 114. The upper pads 112 may be arranged on an upper surface of the insulation substrate. The lower pads 114 may be arranged on a lower surface of the insulation substrate. The upper pads 112 and the lower pads 114 may be electrically connected with each other via conductive patterns in the insulation substrate.

The external terminals 160 may be mounted on the lower pads 114 of the package substrate 110. The external terminals 160 may include solder balls.

The interposer 120 may be arranged over a central portion of the upper surface of the package substrate 110. The interposer 120 may have an area smaller than an area of the package substrate 110. Thus, an edge portion of the upper surface of the package substrate 110 may be exposed by the interposer 120.

The interposer 120 may include a plurality of upper pads 122 and a plurality of lower pads 124. The upper pads 122 may be arranged on an upper surface of the interposer 120. The lower pads 124 may be arranged on a lower surface of the interposer 120. The upper pads 122 and the lower pads 124 in the interposer 120 may be electrically connected with each other via conductive patterns in the interposer 120. The upper pads 122 of the interposer 120 may be positioned at a central portion of the upper surface of the interposer 120. In contrast, the lower pads 124 of the interposer 120 may be uniformly arranged on an entire lower surface of the interposer 120.

A plurality of conductive bumps 170 may be arranged between the lower surface of the interposer 120 and the upper surface of the package substrate 110. Particularly, each of the conductive bumps 170 may be arranged between each of the lower pads 124 of the interposer 120 and each of the upper pads 112 of the package substrate 110. Thus, the lower pads 124 of the interposer 120 may be electrically connected with the upper pads 112 of the package substrate 110 via the conductive bumps 170, respectively.

The semiconductor chip 130 may be arranged over a central portion of the upper surface of the interposer 120. A plurality of bonding pads 132 may be arranged on a lower surface of the semiconductor chip 130. Thus, the lower surface of the semiconductor chip 130 may correspond to an active face of the semiconductor chip 130.

The semiconductor chip 130 may have an area smaller than the area of the interposer 120. Thus, an edge portion of the upper surface of the interposer 120 may be exposed by the semiconductor chip 130. The upper pads 122 of the interposer 120 may be positioned under the semiconductor chip 130. In contrast, because the lower pads 124 of the interposer 120 may be uniformly arranged on the entire lower surface of the interposer 120, the lower pads 124 on an edge portion of the lower surface of the interposer 120 may not be covered by the semiconductor chip 130.

A plurality of conductive bumps 180 may be arranged between the lower surface of the semiconductor chip 130 and the upper surface of the interposer 120. Particularly, the conductive bumps 180 may be arranged between the bonding pads 132 of the semiconductor chip 130 and the upper pads 122 of the interposer 120, respectively. Thus, the bonding pads 132 of the semiconductor chip 130 may be electrically connected with the upper pads 122 of the interposer 120 via the conductive bumps 180, respectively.

The molding member 140 may be formed on the edge portion of the upper surface of the interposer 120 to surround side surfaces of the semiconductor chip 130. That is, the molding member 140 may be configured to make contact with the side surfaces of the semiconductor chip 130. The molding member 140 may include an epoxy molding compound (EMC), but embodiments of the present disclosure are not limited thereto.

In example embodiments, the molding member 140 may have an upper surface substantially coplanar with the upper surface of the semiconductor chip 130. Alternatively, the upper surface of the molding member 140 may be higher or lower than the upper surface of the semiconductor chip 130.

The pillar structure 150 may be vertically arranged in the molding member 140 and the interposer 120. Particularly, the molding member 140 may include a plurality of openings 146 (refer to FIG. 8) vertically formed through the molding member 140. Particularly, each of the openings 146 of the molding member 140 may be positioned just over the upper pads 122 of the interposer 120 on the edge portion of the upper surface of the interposer 120. Further, the interposer 120 may include a plurality of openings 126 (refer to FIG. 8) vertically formed through the interposer 120. The lower pads 124 of the interposer 120 in the edge portion of the lower surface of the interposer 120 may be exposed through the openings 126 of the interposer 120, respectively. Each of the openings 126 of the interposer 120 may be connected to each of the openings 146 of the molding member 140. Thus, the lower pads 124 of the interposer 120 on the edge portion of the lower surface of the interposer 120 may be exposed through a respective one of the openings 126 of the interposer 120 and a respective one of the openings 146 of the molding member 140. The openings 126 of the interposer 120 and the openings 146 of the molding member 140 may have a cylindrical shape, but embodiments of the present disclosure are not limited thereto. For example, the openings 126 of the interposer 120 and the openings 146 of the molding member 140 may have a polygonal shape.

The openings 126 of the interposer 120 and the openings 146 of the molding member 140 may have an arrangement substantially the same as an arrangement of the lower pads 124 of the interposer 120 on the edge portion of the lower surface of the interposer 120. Further, each of the openings 126 of the interposer 120 and the openings 146 of the molding member 140 may have a cross-sectional area of no less than a cross-sectional area of a corresponding one of the lower pads 124 of the interposer 120. For example, the cross-sectional area of the openings 126 of the interposer 120 and the openings 146 of the molding member 140 may be substantially equal to or greater than the cross-sectional area of the corresponding one of the lower pads 124 of the interposer 120. Alternatively, the cross-sectional area of the openings 126 of the interposer 120 and the openings 146 of the molding member 140 may be smaller than the cross-sectional area of the corresponding one of the lower pads 124 of the interposer 120.

The pillar structure 150 may be formed in the openings 126 of the interposer 120 and the openings 146 of the molding member 140. Particularly, the openings 126 of the interposer 120 and the openings of the molding member 140 may be fully filled with the pillar structure 150. Thus, the pillar structure 150 may have a shape determined by the shape of the openings 126 and the openings 146. In example embodiments, because the openings 126 and the openings 146 may have the cylindrical shape, the pillar structure 150 may also have the cylindrical shape. Further, the pillar structure 150 may have a cross-sectional area of no less than the cross-sectional area of the corresponding one of the lower pads 124 of the interposer 120. Alternatively, the cross-sectional area of the pillar structure 150 may be smaller than the cross-sectional area of the corresponding one of the lower pads 124 of the interposer 120.

As mentioned above, because the openings 146 of the molding member 140 may be upwardly exposed, an upper end of the pillar structure 150 in one of the openings 146 of the molding member 140 may also be upwardly exposed. Further, because one of the lower pads 124 of the interposer 120 may be exposed through one of the openings 126 of the interposer 120, a lower end of the pillar structure 150 in the one of the openings 126 of the interposer 120 may be configured to make contact with the one of the lower pads 124 of the interposer 120. In example embodiments, the pillar structure 150 may include a pillar array having an arrangement substantially the same as the arrangement of the lower pads 124 of the interposer 120. The pillar array may be configured to individually make contact with the lower pads 124 of the interposer 120.

When the interposer 120 may be bonded to the package substrate 110 via the conductive bumps 170 using a bond tool T (refer to FIG. 11), the bond tool T may thermally compress the upper surfaces of the molding member 140 and the semiconductor chip 130 to apply heat to the conductive bumps 170. The pillar structure 150 may function as a heat transfer path from the bond tool T to at least one of the conductive bumps 170.

The pillar structure 150 as the heat transfer path may include a material having a thermal conductivity higher than a thermal conductivity of the molding member 140. In example embodiments, the pillar structure 150 may include a metal, but embodiments of the present disclosure are not limited thereto. For example, the pillar structure 150 may include Cu, Au, Al, etc., but embodiments of the present disclosure are not limited thereto.

Figure 4:
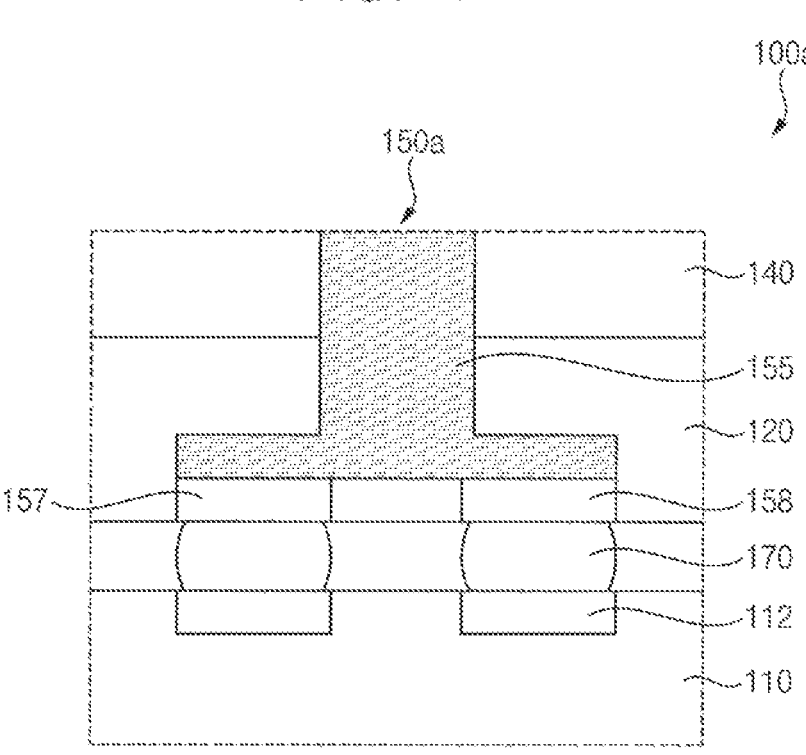

FIG. 4 is an enlarged cross-sectional view illustrating a connection between a pillar structure and lower pads of an interposer in a fan-out type semiconductor package in accordance with example embodiments.

A fan-out type semiconductor package 100a of example embodiments may include elements substantially the same as those of the fan-out type semiconductor package 100 in FIG. 1 except for a pillar structure. Thus, the same reference numerals may refer to the same elements and any further illustrations with respect to the same elements may be omitted herein for brevity.

Referring to FIG. 4, a pillar structure 150a of example embodiments may include a main pillar 155 and a plurality of sub-pillars 157 and 158. In example embodiments, the sub-pillars 157 and 158 may be two, but embodiments of the present disclosure are not limited thereto.

The sub-pillars 157 and 158 may be branched from a lower end of the main pillar 155. Each of the sub-pillars 157 and 158 may be configured to make contact with adjacent lower pads 124 among the lower pads 124 of the interposer 120. That is, the single main pillar 155 may be connected with the adjacent lower pads 124 (refer to FIG. 3) of the interposer 120 via the sub-pillars 157 and 158.

Figure 5:
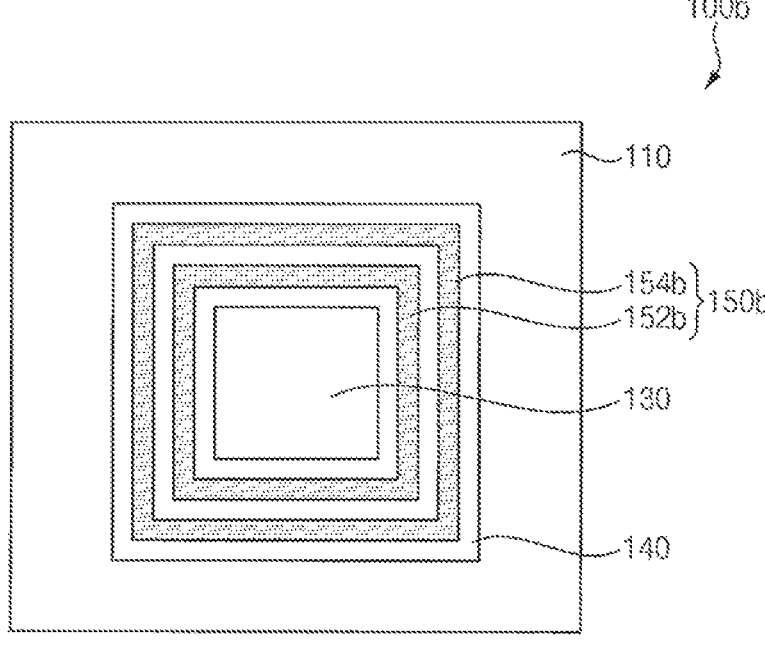

FIG. 5 is a plan view illustrating a fan-out type semiconductor package in accordance with example embodiments.

A fan-out type semiconductor package 100b of example embodiments may include elements substantially the same as those of the fan-out type semiconductor package 100 in FIG. 1 except for a pillar structure. Thus, the same reference numerals may refer to the same elements and any further illustrations with respect to the same elements may be omitted herein for brevity.

Referring to FIG. 5, a pillar structure 150b of example embodiments may include an inner pillar 152b and at least one outer pillar 154b.

The inner pillar 152b may be configured to surround the side surfaces of the semiconductor chip 130. For example, the inner pillar 152b may have a rectangular frame shape configured to surround the side surfaces of the semiconductor chip 130, but embodiments of the present disclosure are not limited thereto.

The outer pillar 154b may be configured to surround the inner pillar 152b. For example, the outer pillar 154b may have a rectangular frame shape configured to surround the inner pillar 152b, but embodiments of the present disclosure are not limited thereto.

A pitch between the inner pillar 152b and the outer pillar 154b may be substantially the same as a pitch between the lower pads 124 of the interposer 120.

Figure 6:
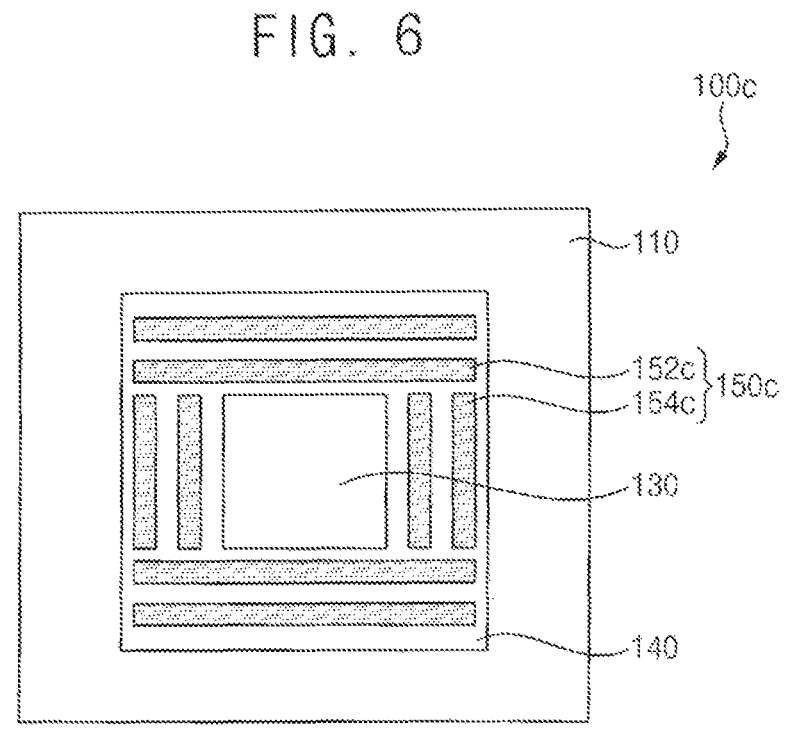

FIG. 6 is a plan view illustrating a fan-out type semiconductor package in accordance with example embodiments.

A fan-out type semiconductor package 100c of example embodiments may include elements substantially the same as those of the fan-out type semiconductor package 100 in FIG. 1 except for a pillar structure. Thus, the same reference numerals may refer to the same elements and any further illustrations with respect to the same elements may be omitted herein for brevity.

Referring to FIG. 6, a pillar structure 150c of example embodiments may include at least one first pillar 152c and at least one second pillar 154c.

The first pillar 152c may extend parallel to opposite first side surfaces among the side surfaces of the semiconductor chip 130. In example embodiments, the first pillar 152c may include two pillars parallel to each other, but embodiments of the present disclosure are not limited thereto. A pitch between the two of the first pillar 152c may be substantially the same as the pitch between the lower pads 124 of the interposer 120.

The second pillar 154c may be substantially perpendicular to the first pillar 152c. That is, the second pillar 154c may extend parallel to opposite second side surfaces among the side surfaces of the semiconductor chip 130, which are different from the first side surfaces. In example embodiments, the second pillar 154c may include two pillars parallel to each other, but embodiments of the present disclosure are not limited thereto. A pitch between the two of the second pillar 154c may be substantially the same as the pitch between the lower pads 124 of the interposer 120.

FIGS. 7 to 11 are cross-sectional views illustrating a method of manufacturing the fan-out type semiconductor package in FIG. 1.

Figure 7:
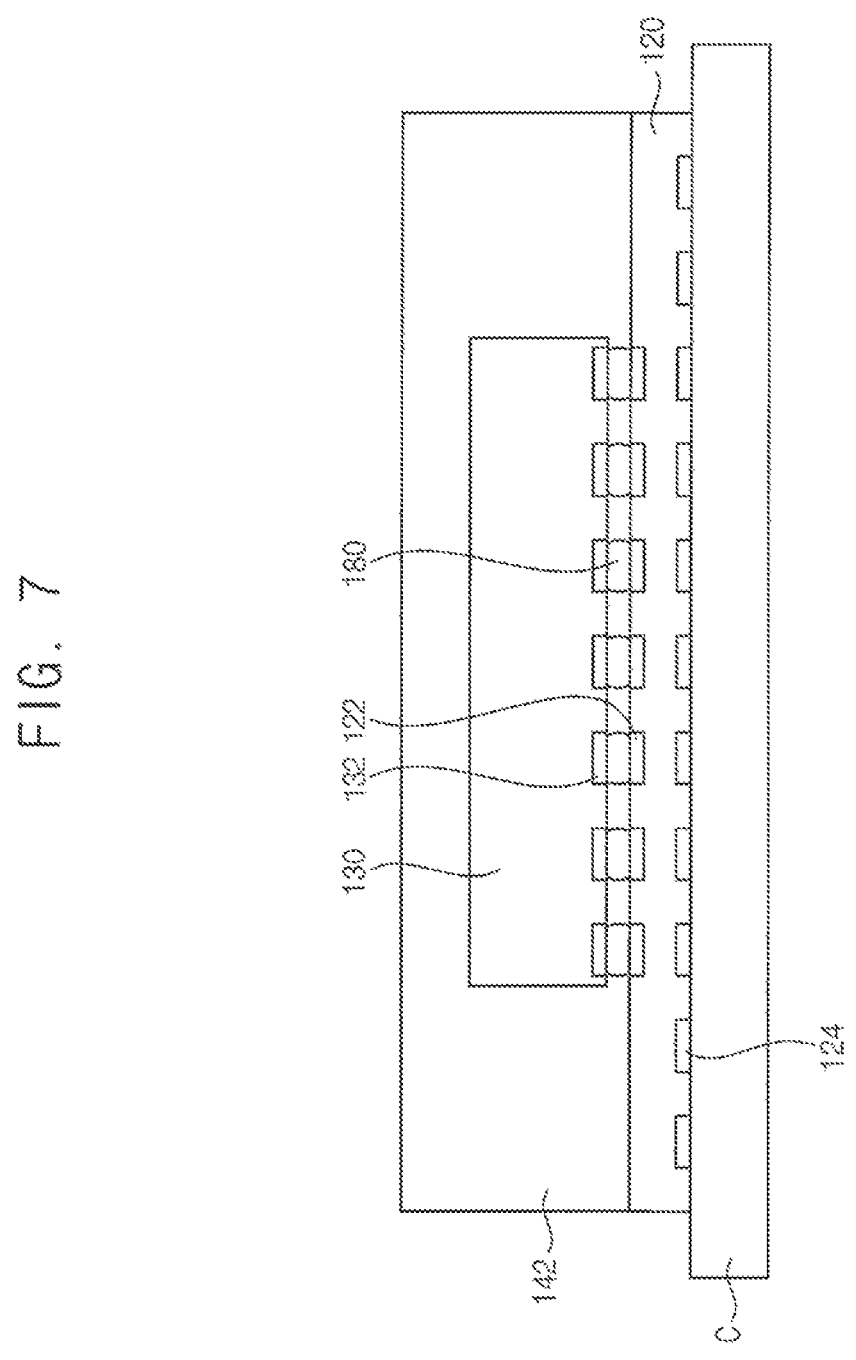

Referring to FIG. 7, the semiconductor chip 130 may be bonded to the upper surface of the interposer 120 via the conductive bumps 180. The bonding pads 132 of the semiconductor chip 130 may be electrically connected to the upper pads 122 of the interposer 120 via the conductive bumps 180.

The lower surface of the interposer 120 with the semiconductor chip 130 may be attached to an upper surface of a carrier substrate C. A preliminary molding member 142 may be formed on the edge portion of the upper surface of the interposer 120 to surround the semiconductor chip 130 with the preliminary molding member 142. The preliminary molding member 142 may cover the side surfaces and the upper surface of the semiconductor chip 130. That is, the preliminary molding member 142 may have an upper surface higher than the upper surface of the semiconductor chip 130.

Figure 8:
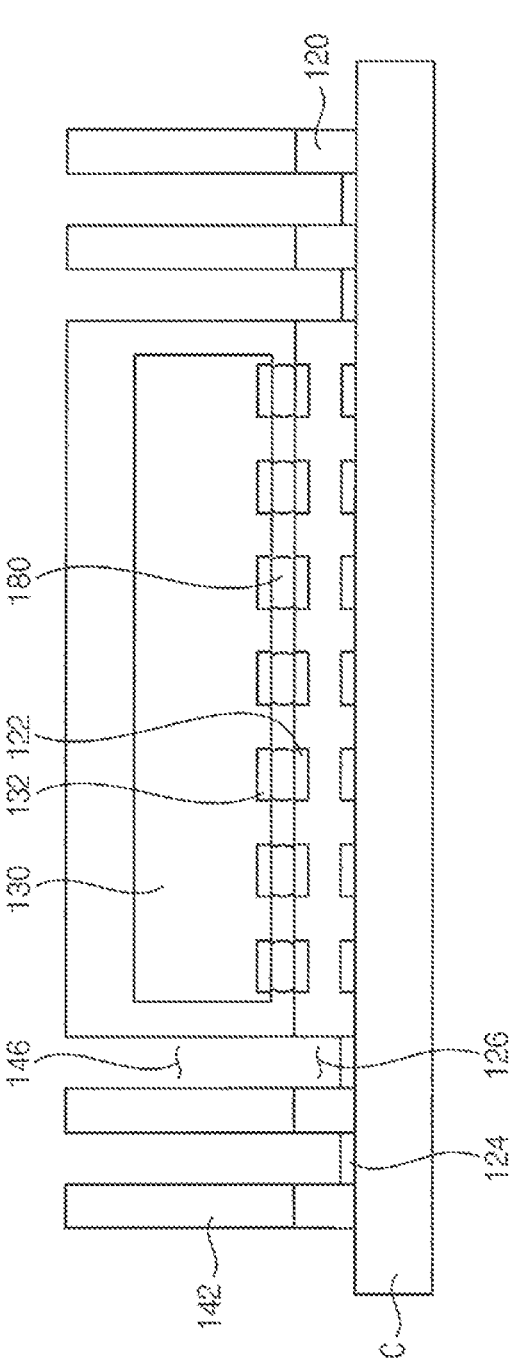

Referring to FIG. 8, the openings 126 and the openings 146 may be formed through the preliminary molding member 142 and the interposer 120. The lower pads 124 on the edge portion of the lower surface of the interposer 120 may be exposed through the openings 126 and the openings 146. The openings 126 and the openings 146 may be formed by a sawing process, an etching process, etc. In example embodiments, the openings 126 and the openings 146 may have the structure described with reference to FIG. 2. Alternatively, the openings 126 and 146 may have any one of the structures described with reference to FIGS. 4 to 6.

Figure 9:
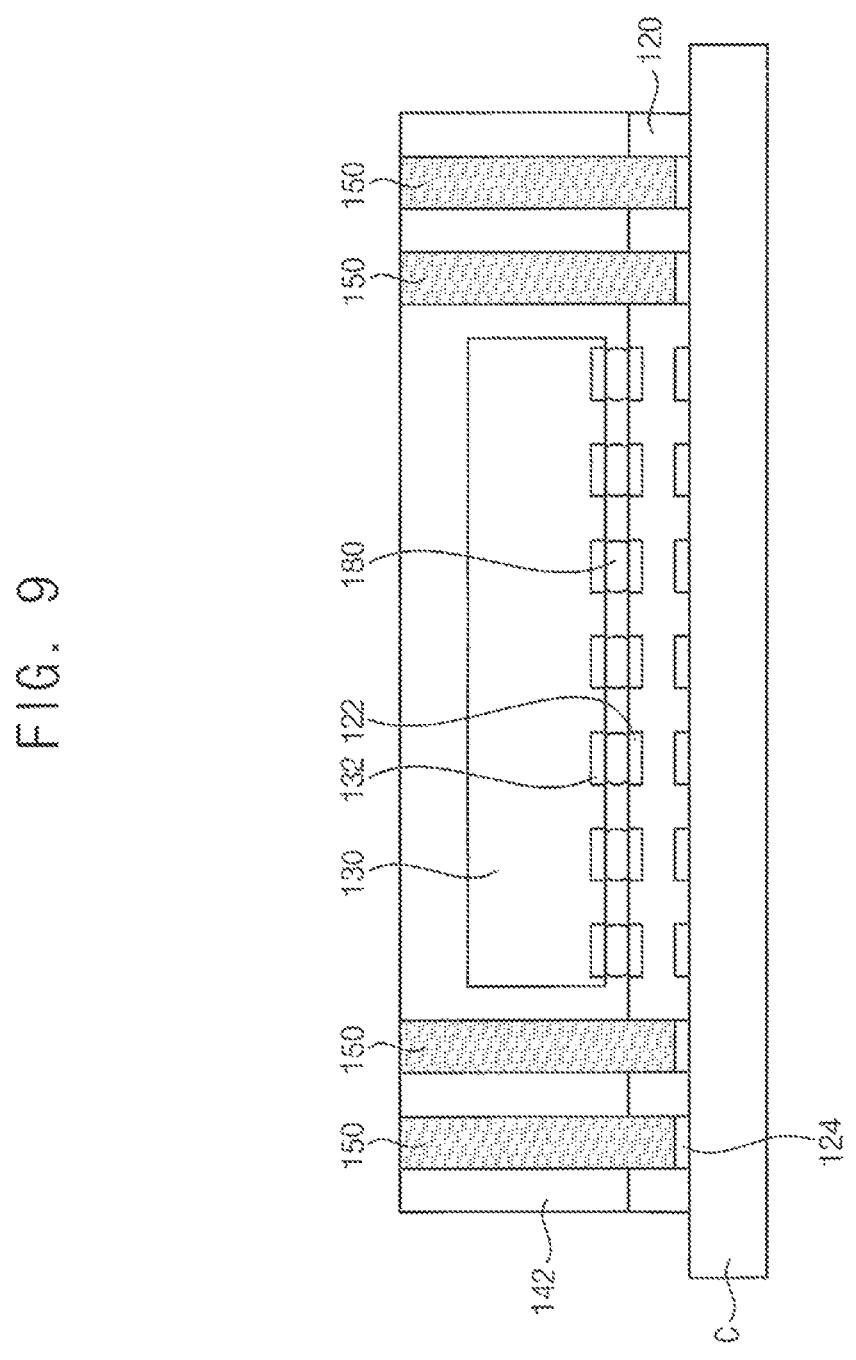

Referring to FIG. 9, the openings 126 and the openings 146 may be filled with the material having the thermal conductivity higher than the thermal conductivity of the preliminary molding member 142. For example, the openings 126 and the openings 146 may be filled with the metal. The formation of the metal in the openings 126 and openings 146 may include a plating process, but embodiments of the present disclosure are not limited thereto.

Figure 10:
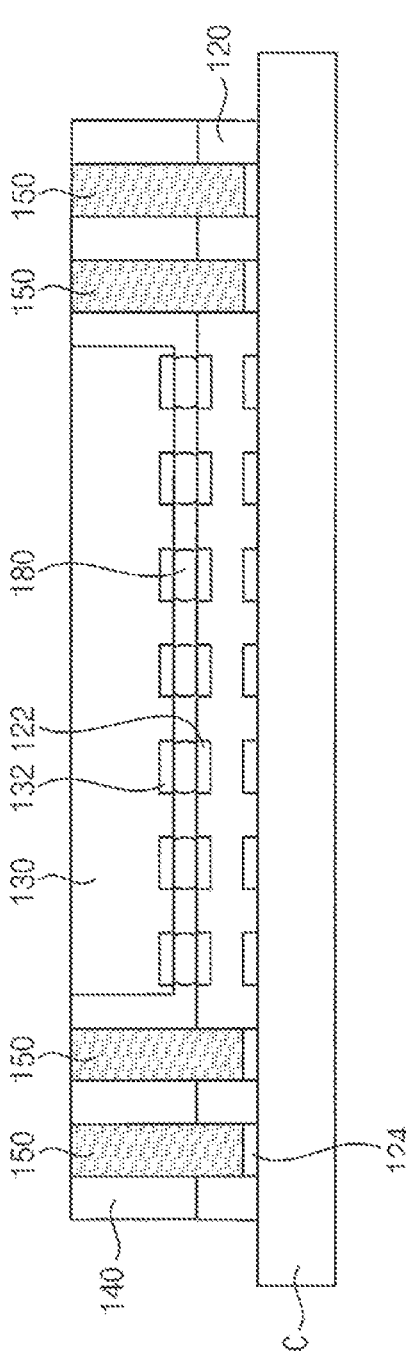

Referring to FIG. 10, the upper surface of the preliminary molding member 142 and the metal in the openings 126 and the openings 146 may be removed until the upper surface of the semiconductor chip 130 may be exposed to form the molding member 140 and the pillar structure 150. In example embodiments, the upper surface of the preliminary molding member 142 and the metal may be removed by a grinding process, but embodiments of the present disclosure are not limited thereto. Further, when the upper surface of the preliminary molding member 142 and the metal is removed, the upper surface of the semiconductor chip 130 may be partially removed to reduce a thickness of the semiconductor chip 130. The carrier substrate C may then be detached from the interposer 120.

Figure 11:
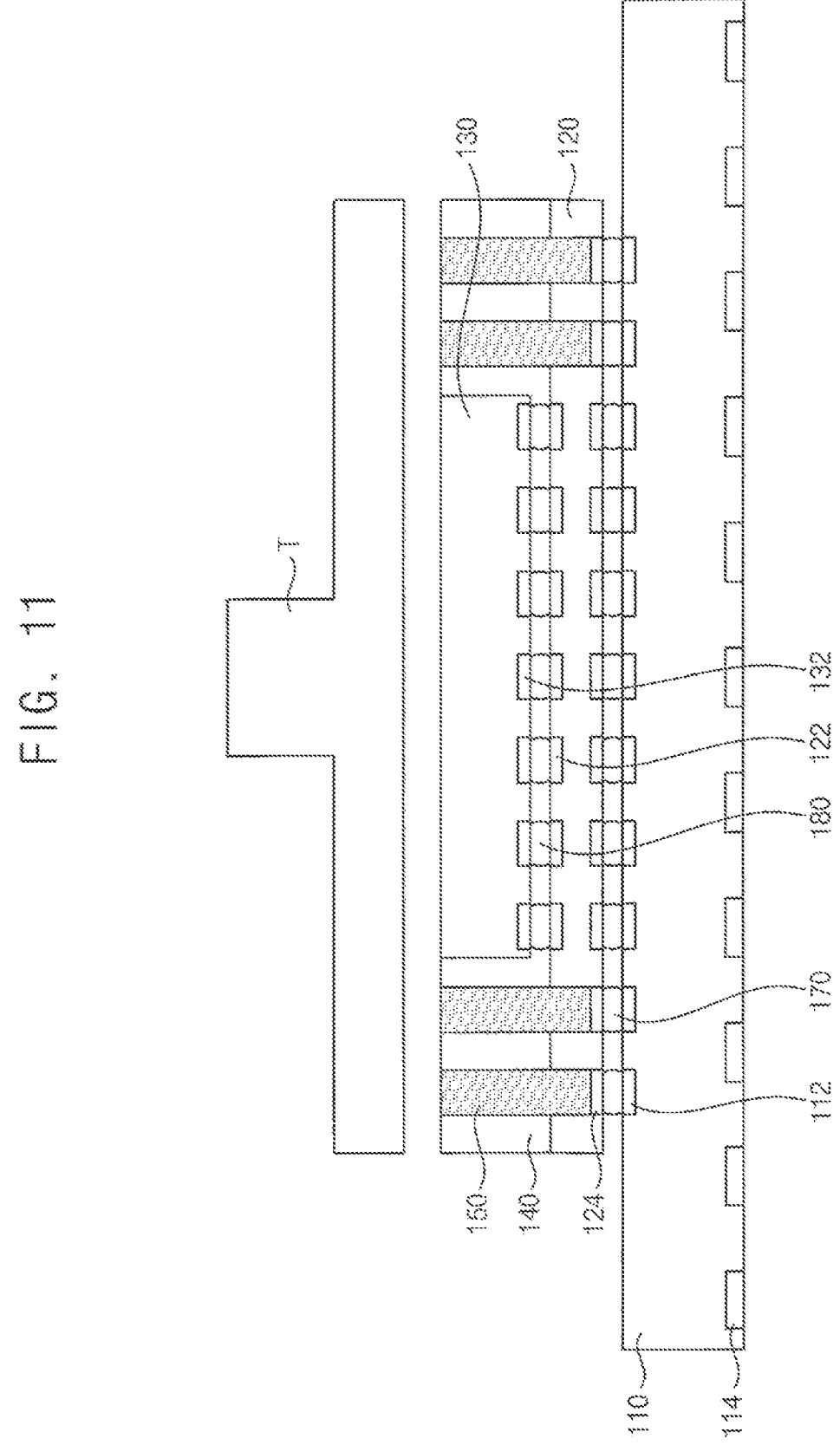

Referring to FIG. 11, the conductive bumps 170 may be arranged between the interposer 120 and the package substrate 110. As mentioned above, the lower end of the pillar structure 150 may make contact with a corresponding one of the lower pads 124 on the edge portion of the interposer 120. Thus, a corresponding one of the conductive bumps 170 under the edge portion of the interposer 120 may be connected with the pillar structure 150 via the corresponding one of the lower pads 124 of the interposer 120.

The bond tool T may thermally compress the upper surfaces of the molding member 140 and the semiconductor chip 130. The heat of the bond tool T may be effectively transferred to the conductive bumps 170 under the central portion of the interposer 120 through the semiconductor chip 130. Thus, the conductive bumps 170 under the central portion of the interposer 120 may receive the sufficient heat so that the conductive bumps 170 under the central portion of the interposer 120 may be normally wetted.

Further, because the upper end of the pillar structure 150 may be exposed through the upper surface of the molding member 140, the upper end of the pillar structure 150 may directly make contact with the bond tool T. Thus, the heat of the bond tool T may be directly transferred to the lower pads 124 under the edge portion of the interposer 120 through the pillar structure 150. As mentioned above, because the lower pads 124 on the edge portion of the interposer 120 may be directly connected to the pillar structure 150, the heat of the bond tool T may be effectively transferred to the conductive bumps 170 under the edge portion of the interposer 120 through the pillar structure 150 and the lower pad 124. Therefore, the conductive bumps 170 under the edge portion of the interposer 120 may receive the sufficient heat so that the conductive bumps 170 under the edge portion of the interposer 120 may also be normally wetted.

According to example embodiments, the heat of the bond tool T may be effectively transferred to the conductive bumps 170 through the semiconductor chip 130 and the pillar structure 150 having the thermal conductivities higher than the thermal conductivity of the molding member 140 so that the conductive bumps 170 may be sufficiently wetted. As a result, the electrical connection between the interposer 120 and the package substrate 110 may be secured due to the sufficiently wetted conductive bumps 170.

Further, the pillar structure 150 vertically arranged in the molding member 140 may reinforce the strength of the molding member 140. Thus, when the bond tool T thermally compresses the upper surfaces of the molding member 140 and the semiconductor chip 130, the warpage of the interposer 120 and/or the semiconductor chip 130 may be suppressed.

The external terminals 160 may be mounted on the lower pads 114 of the package substrate 110 to complete the fan-out type semiconductor package 100 in FIG. 1.

Figure 12:
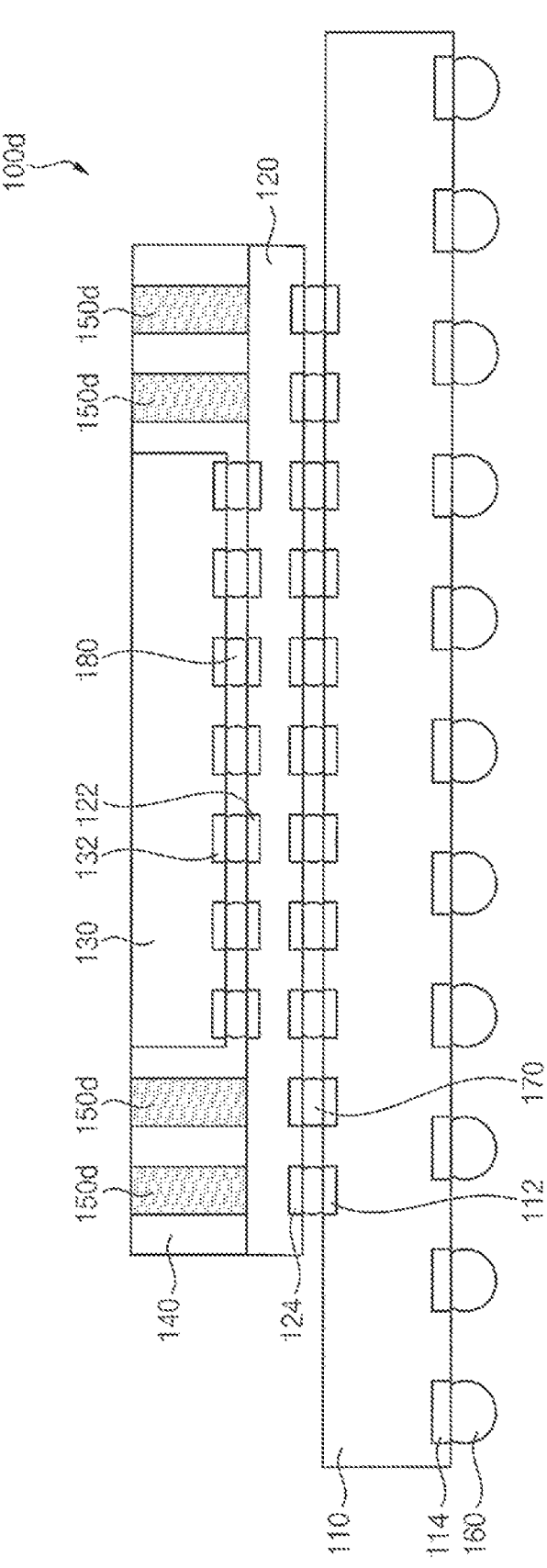
Figure 13:
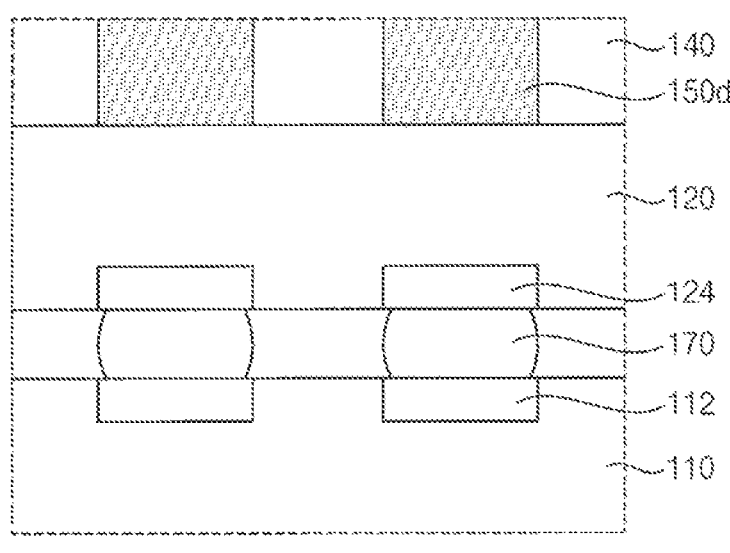

FIG. 12 is a cross-sectional view illustrating a fan-out type semiconductor package in accordance with example embodiments and FIG. 13 is an enlarged cross-sectional view illustrating a connection between a pillar structure and lower pads of an interposer in the fan-out type semiconductor package in FIG. 12.

A fan-out type semiconductor package 100d of example embodiments may include elements substantially the same as those of the fan-out type semiconductor package 100 in FIG. 1 except for a pillar structure. Thus, the same reference numerals may refer to the same elements and any further illustrations with respect to the same elements may be omitted herein for brevity.

Referring to FIGS. 12 and 13, a pillar structure 150d of example embodiments may be formed only in the molding member 140. That is, the pillar structure 150d may not be formed in the interposer 120. Thus, the pillar structure 150d may not be connected with the lower pads 124 on the edge portion of the interposer 120. However, the pillar structure 150d may be positioned just over a corresponding one of the lower pads 124 on the edge portion of the interposer 120.

Although the pillar structure 150d may not be directly connected to the lower pads 124 on the edge portion of the interposer 120, a lower end of the pillar structure 150d may be positioned adjacent to the corresponding one of the lower pads 124 on the edge portion of the interposer 120 so that the heat of the bond tool T may be readily transferred to the corresponding one of the lower pads 124 on the edge portion of the interposer 120 through the pillar structure 150d. That is, heat transfer efficiency from the bond tool T to the corresponding one of the lower pads 124 on the edge portion of the interposer 120 through the pillar structure 150d may be higher than heat transfer efficiency from the bond tool T to the corresponding one of the lower pads 124 on the edge portion of the interposer 120 through the molding member 140.

A method of manufacturing the fan-out type semiconductor package 100d in FIG. 12 may include processes substantially the same as those illustrated and described with reference to FIGS. 7 to 11 except that the openings 145 are only formed in the molding member 140, not the interposer 120. Thus, any further illustrations with respect to the method may be omitted for brevity.

According to example embodiments, the heat of the bond tool may be rapidly transferred to the conductive bumps between the interposer and the package substrate under the molding member through the pillar structure in the molding member so that the conductive bumps may be sufficiently wetted. Thus, the interposer may be firmly bonded to the package substrate via the sufficiently wetted conductive bumps to prevent an electrical connection failure between the interposer and the package substrate.

Further, the pillar structure in the molding member may function as to reinforce strength of the molding member. Thus, a warpage may not be generated at the semiconductor chip and/or the interposer in thermally compressing the upper surface of the molding member using the bond tool.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of embodiments of the present disclosure. Accordingly, all such modifications are intended to be included within the scope of the present disclosure. In the claims, any means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments described herein, and that modifications to the described example embodiments, as well as other example embodiments, are intended to be included within the scope of the present disclosure.

What is claimed is:

1. A fan-out type semiconductor package comprising:
   a package substrate;
   an interposer on an upper surface of the package substrate, the interposer comprising upper pads and lower pads electrically connected with the upper pads;
   conductive bumps between the package substrate and the lower pads of the interposer and electrically connecting the package substrate with the interposer;
   a semiconductor chip on a central portion of an upper surface of the interposer and electrically connected with the upper pads of the interposer, the semiconductor chip having a width narrower than a width of the interposer;
   a molding member on an edge portion of the upper surface of the interposer such as to surround side surfaces of the semiconductor chip, the molding member comprising an upper surface coplanar with an upper surface of the semiconductor chip; and
   at least one metal pillar structure vertically extending from the upper surface of the molding member to a lower surface of the interposer and configured to individually make contact with at least one of the lower pads of the interposer, the at least one metal pillar structure having a width that is equal to or greater than a width of the at least one of the lower pads of the interposer.

2. The fan-out type semiconductor package of claim 1, wherein the at least one metal pillar structure comprises a plurality of metal pillar structures comprising:

an inner pillar surrounding the semiconductor chip in at least a first horizontal direction and a second horizontal direction, opposite to the first horizontal direction; and at least one outer pillar surrounding the inner pillar in at least the first horizontal direction and the second horizontal direction.

3. The fan-out type semiconductor package of claim 1, wherein the at least one metal pillar structure comprises a plurality of metal pillar structures comprising a pillar array having a pitch that is the same as a pitch between the lower pads of the interposer.

4. The fan-out type semiconductor package of claim 1, wherein the at least one metal pillar structure comprises a plurality of metal pillar structures comprising:

at least one first pillar extending parallel to opposite side surfaces among the side surfaces of the semiconductor chip; and at least one second pillar extending perpendicular to the at least one first pillar.

5. A fan-out type semiconductor package comprising:

a package substrate;

an interposer on an upper surface of the package substrate, the interposer comprising upper pads and lower pads electrically connected with the upper pads;

conductive bumps between the package substrate and the lower pads of the interposer and electrically connecting the package substrate with the interposer;

a semiconductor chip on a central portion of an upper surface of the interposer and electrically connected with the upper pads of the interposer, the semiconductor chip having a width narrower than a width of the interposer;

a molding member on an edge portion of the upper surface of the interposer such as to surround side surfaces of the semiconductor chip, the molding member comprising an upper surface coplanar with an upper surface of the semiconductor chip; and at least one pillar structure in the molding member, the at least one pillar structure comprising a material having a thermal conductivity higher than a thermal conductivity of the molding member, wherein the at least one pillar structure vertically extends from the upper surface of the molding member to a lower surface of the interposer.

6. The fan-out type semiconductor package of claim 5, wherein the at least one pillar structure makes contact with at least one of the lower pads of the interposer.

7. The fan-out type semiconductor package of claim 6, wherein the at least one pillar structure comprises a plurality of pillar structures, and the plurality of pillar structures are configured to individually make contact with the lower pads of the interposer.

8. The fan-out type semiconductor package of claim 7, wherein the at least one pillar structure has a width area that is equal to or greater than a width of each of the lower pads of the interposer.

9. The fan-out type semiconductor package of claim 6, wherein the at least one pillar structure comprises a single pillar structure that makes contact with adjacent lower pads among the lower pads of the interposer.

10. The fan-out type semiconductor package of claim 5, wherein the at least one pillar structure comprises a plurality of pillar structures comprising:

an inner pillar configured surrounding the semiconductor chip in at least a first horizontal direction and a second horizontal direction, opposite to the first horizontal direction; and at least one outer pillar surrounding the inner pillar in at least the first horizontal direction and the second horizontal direction.

11. The fan-out type semiconductor package of claim 10, wherein each of the inner pillar and the at least one outer pillar has a rectangular frame shape.

12. The fan-out type semiconductor package of claim 5, wherein the at least one pillar structure comprises a plurality of pillar structures comprising a pillar array having a pitch that is the same as a pitch between the lower pads of the interposer.

13. The fan-out type semiconductor package of claim 5, wherein the at least one pillar structure comprises a plurality of pillar structures comprising:

at least one first pillar extending parallel to opposite side surfaces among the side surfaces of the semiconductor chip; and at least one second pillar extending perpendicular to the at least one first pillar.

14. The fan-out type semiconductor package of claim 5, wherein the at least one pillar structure comprises a metal.

15. The fan-out type semiconductor package of claim 5, wherein the molding member comprises an upper surface that is coplanar with an upper surface of the semiconductor chip.

16. The fan-out type semiconductor package of claim 5, further comprising:

conductive bumps between the upper pads of the interposer and the semiconductor chip; and external terminals mounted on a lower surface of the package substrate.

* * * * *